United States Patent [19]

Maruyama et al.

[11] Patent Number: 5,031,147
[45] Date of Patent: Jul. 9, 1991

[54] SEMICONDUCTOR MEMORY

[75] Inventors: Keiji Maruyama, Kawasaki; Ryosuke Matsuo, Yokohama, both of Japan

[73] Assignee: Kabushiki Kaisha Toshiba, Kawasaki, Japan

[21] Appl. No.: 380,336

[22] Filed: Jul. 17, 1989

[30] Foreign Application Priority Data

Jul. 26, 1988 [JP] Japan ................... 63-186287
Dec. 26, 1988 [JP] Japan ................... 63-328168

[51] Int. Cl.$^5$ .................................... G11C 11/406
[52] U.S. Cl. .......................... 365/189.07; 365/222; 340/146.2
[58] Field of Search ............ 365/222, 189.07; 340/146.2

[56] References Cited

U.S. PATENT DOCUMENTS

| | | | |
|---|---|---|---|
| 3,829,664 | 8/1974 | Kashio | 340/146.2 |
| 4,110,737 | 8/1978 | Fahey | 340/146.2 |
| 4,119,946 | 10/1978 | Taylor | 340/146.2 |
| 4,551,031 | 11/1985 | Ishikawa et al. | 340/146.2 |
| 4,591,853 | 5/1986 | Mori | 340/146.2 |
| 4,716,552 | 12/1987 | Maltiel et al. | 365/222 |
| 4,807,289 | 2/1989 | Nakajima | 365/222 |
| 4,849,936 | 7/1989 | Mizutani | 365/222 |
| 4,873,666 | 10/1989 | Lefebvre et al. | 365/189.07 |
| 4,873,667 | 10/1989 | Geadah et al. | 365/189.07 |

FOREIGN PATENT DOCUMENTS 56-61086 5/1981 Japan ................... 365/222

OTHER PUBLICATIONS

Reese, E., et al., A 4K×8 Dynamic RAM with Self-Refresh, IEEE Journal of Solid-State Circuits, vol. SC-16, No. 5, Oct., 1981.

Primary Examiner—Joseph E. Clawson, Jr.
Attorney, Agent, or Firm—Finnegan, Henderson, Farabow, Garrett, and Dunner

[57] ABSTRACT

A semiconductor memory comprises a semiconductor memory circuit, a counter section for causing at least a part of counters to operate in association with an operation of the semiconductor memory circuit, and a counter comparator for comparing the logic state outputs of two independent counters of the counter section with each other, the output of the counter comparator being used to control the semiconductor memory circuit.

6 Claims, 7 Drawing Sheets

SEMICONDUCTOR MEMORY

BACKGROUND OF THE INVENTION

1. Field of the Invention

The present invention relates to a semiconductor memory having a counter comparator for controlling the operation of a semiconductor memory circuit.

2. Description of the Related Art

Semiconductor memories which use dynamic memory cells require periodic refreshing in order to retain cell data. However, since such a conventional semiconductor memory executes a refreshing operation every time it receives a refresh request signal from an external unit, this may result in more refreshing operations being performed than are actually required by the memory, and unnecessary consumption of power current.

In a system employing a plurality of memories, a refresh request signal is generally supplied, without being decoded, from an external unit to all the memories contained therein, so that upon reception of this signal, all the memories in the system perform a refreshing operation, and a large amount of power current is consumed. If such a system has a battery as a backup power source voltage, the battery power supply will inevitably be quickly used up by such excessive power consumption. In addition, when the power source of the system is burdened by a high refreshing current, a power source noise may be generated, which may well result in the system malfunctioning.

SUMMARY OF THE INVENTION

Accordingly, it is an object of this invention to provide a semiconductor memory which can overcome, by itself, the above problem associated with the refreshing operation, and can significantly reduce the average amount of refreshing current consumed.

To achieve the above object, according to this invention, there is provided a semiconductor memory comprising a semiconductor memory circuit, a counter section for causing at least a part of the counters to operate in conjunction with an operation of the semiconductor memory circuit, and a counter comparator for comparing the logic state of two independent counters of the counter section with each other, the comparator output being used to control the semiconductor memory circuit.

According to this invention, the number of refreshing operations actually executed by the semiconductor memory circuit is counted by one counter, while the number of refreshing operations actually required is counted by the other, and the logic state of the two counters are compared by the counter comparator. If a coincidence is not attained, the semiconductor memory circuit is subjected to a refreshing operation upon reception of an externally-supplied refresh request signal, whereas if a coincidence does occur, a refresh request signal is ignored and no refreshing operation is executed. This permits the memory itself to receive the externally-supplied refresh request signals in chronological order, to thereby perform the refreshing operation on a selective basis and, as a consequence, to significantly reduce the average amount of refreshing current consumed.

DETAILED DESCRIPTION OF THE PREFERRED EMBODIMENTS

Figure 1:
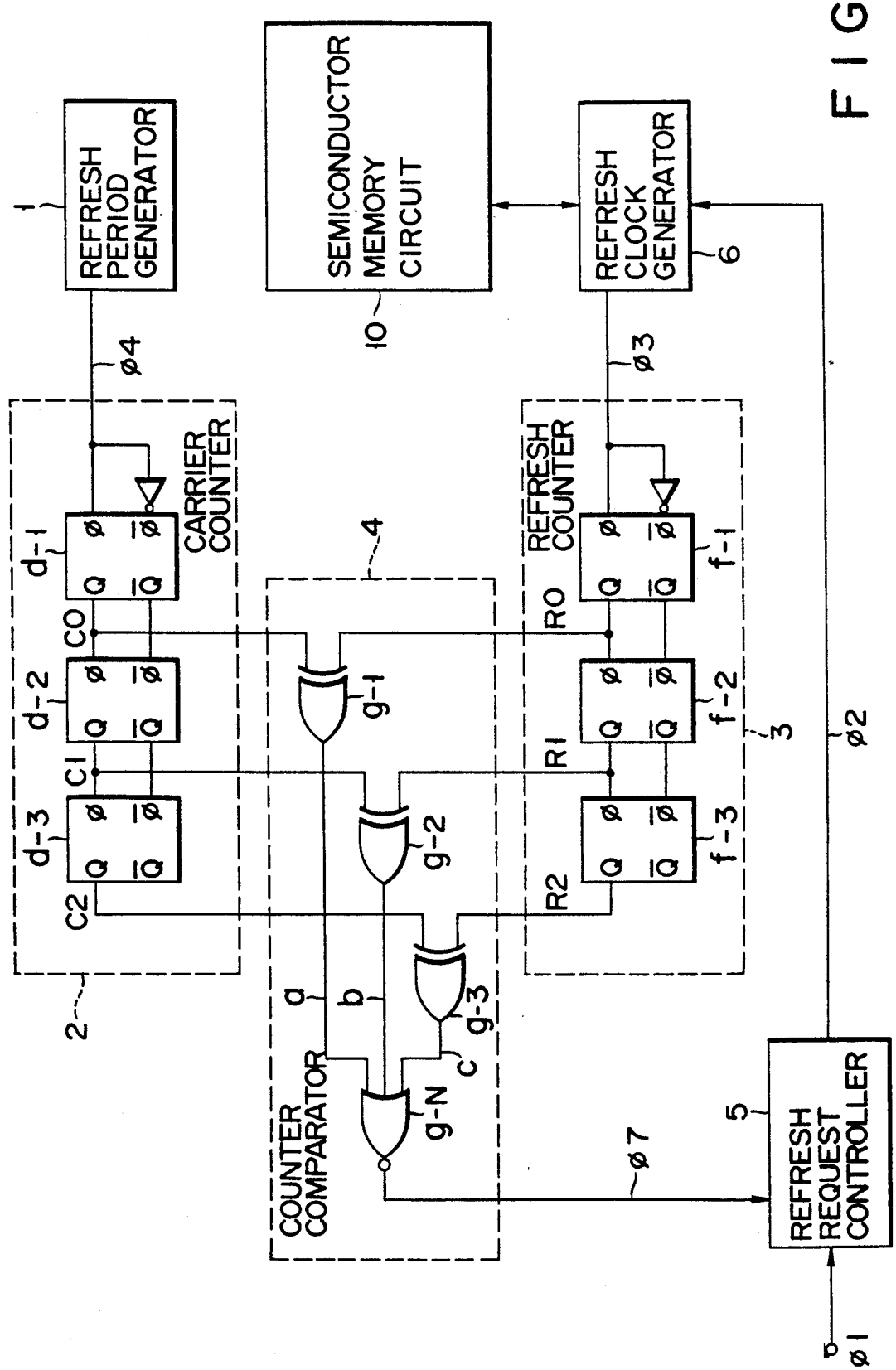
FIG. 1 is a block circuit diagram of a semiconductor memory according to one embodiment of this invention.

Preferred embodiments of this invention will now be described, with reference to the accompanying drawings. Like reference numerals or symbols are used throughout the diagrams to specify identical or corresponding components, and thereby to avoid an otherwise redundant description thereof.

FIG. 1 is a block circuit diagram illustrating a semiconductor memory integrated circuit as an embodiment of this invention. The memory circuit includes a semiconductor memory circuit 10 which employs dynamic memory cells.

A refresh period generator 1 includes an oscillator which operates in a synchronization with a clock pulse of the internal circuit of the semiconductor memory circuit 10. When power is given to the memory, the refresh period generator 1 outputs a clock pulse $\phi 4$ having a constant period. The period of clock pulse $\phi 4$ is set as long as possible; its upper limit is determined by the memory holding characteristic of the memory cells. A counter section (hereinafter referred to as a carrier counter) 2, for counting the number of refreshing operations required, includes a plurality of flip-flop circuits d-1 to d-3, and upon reception of the clock pulse $\phi 4$, executes a count-up operation at the rising of the pulse $\phi 4$ from its "L" level to an "H" level. A counter section (hereinafter referred to as a refresh counter) 3, for counting the number of refreshing operations executed, includes a plurality of flip-flop circuits f-1 to f-3, and upon reception of a refresh execute signal $\phi 3$, executes a count-up operation at the rising of the signal $\phi 3$ from its "L" level to an "H" level. A counter comparator 4 compares corresponding each the logic state outputs C0-C2 of the carrier counter 2 with a corresponding the logic state outputs R0-R2 of the refresh counter 3, to detect whether or not there is a coincidence therebetween. The counter comparator 4 includes a plurality of exclusive OR circuits g-1 to g-3 to which the logic state (C0, R0), (C1, R1), and (C2, R2) of the counters 2 and 3 are supplied, and an NOR circuit g-N which receives the outputs a to c of the circuits g-1 to g-3 and outputs a comparison signal $\phi 7$.

The operation of an exclusive OR circuit (e.g., g-1) is shown in the following Table I.

TABLE I

| Inputs | | Output |
|---|---|---|
| C0 | R0 | a |
| L | L | L |
| H | L | H |
| L | H | H |
| H | H | L |

It should be noted from the Table 1 that when the output levels of the logic state of the counters 2 and 3—which are input to a corresponding exclusive OR circuit—coincide with each other, the output level of the exclusive OR circuit in question becomes "L." The other exclusive OR circuits operate in a similar manner.

The operation of the counter comparator 4 is shown in the following Table II.

TABLE II

| Outputs Of Exclusive OR Circuit | | | Comparison Signal |
|---|---|---|---|
| a | b | c | $\phi 7$ |
| L | L | L | H |
| H | L | L | L |
| L | H | L | L |
| H | H | L | L |
| L | L | H | L |
| H | L | H | L |
| L | H | H | L |
| H | H | H | L |

It should be noted from the Table II that when the output levels of the logic state of the counters 2 and 3 coincide with each other, all of the outputs of the exclusive OR circuits have an "L" level and the comparison signal $\phi 7$ an "H" level, and vice versa.

A refresh request controller 5 receives the comparison signal $\phi 7$ and an externally-supplied refresh request signal $\phi 1$, and is enabled when the signal $\phi 7$ is at the "L" level and disabled when it is at the "H" level. When disabled, the refresh request controller 5 does not output an internal refresh request signal $\phi 2$ even upon reception of the externally-supplied refresh request signal $\phi 1$, whereas when it is in an enabled state, the controller 5 accepts the refresh request signal $\phi 1$ as a refresh request when this signal $\phi 1$ falls from the "H" level to the "L" level, and then sets the level of the internal refresh request signal $\phi 2$ from "H" to "L" before outputting it. A refresh clock generator 6 executes a refreshing operation of the semiconductor memory circuit 10 when the level of the internal refresh request signal $\phi 2$ falls from "H" to "L" and then outputs a refresh execute signal $\phi 3$.

Figure 2:
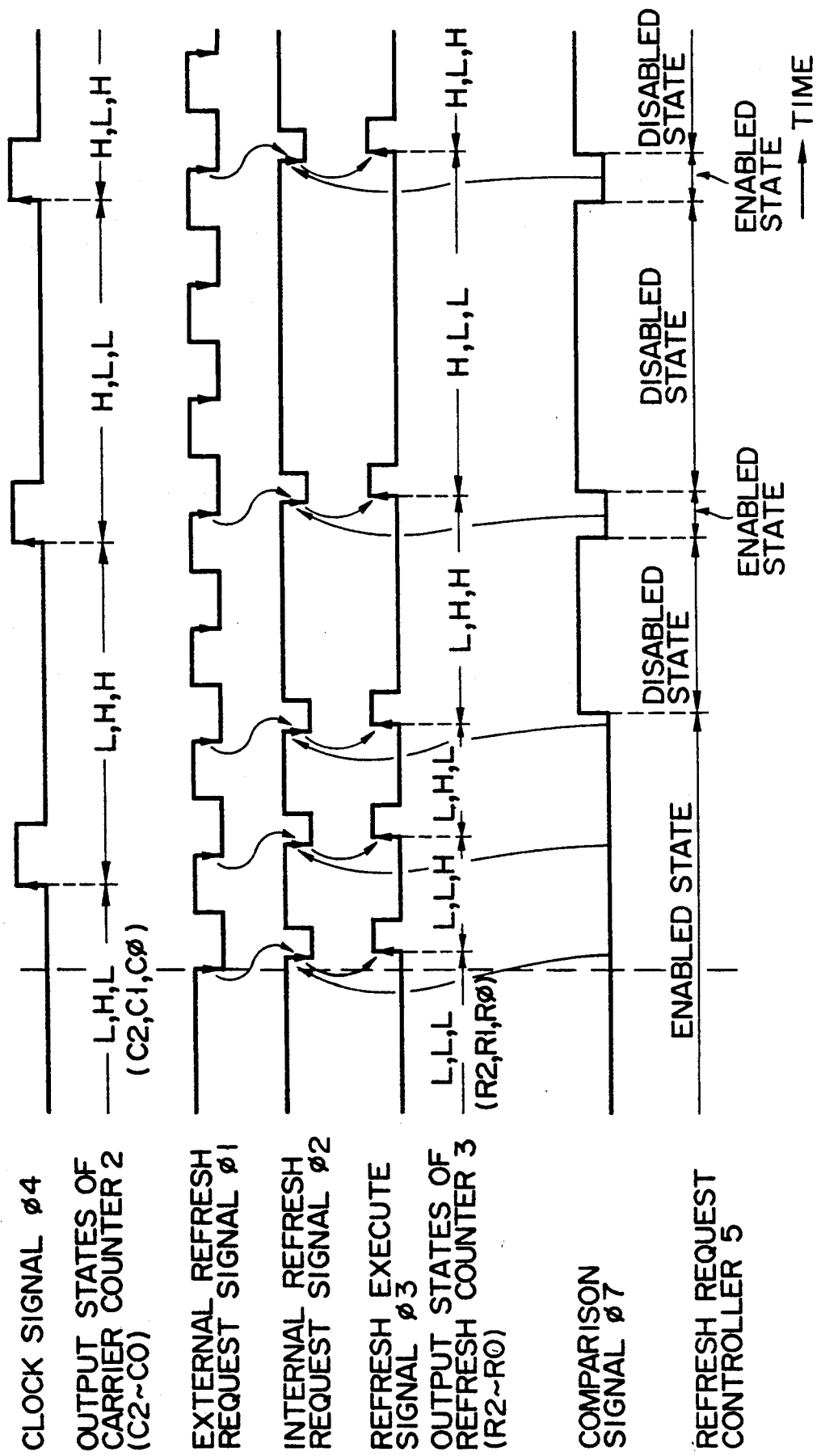
FIG. 2 is a waveform diagram illustrating the operation of, the circuit shown in FIG. 1.

Controlling of the refreshing operation of the above semiconductor memory will now be described, with reference to the waveform diagram of FIG. 2.

When the period of the refresh request signal $\phi 1$ is shorter than the period of the clock pulse $\phi 4$ which is outputted from the refresh period generator 1, the count-up operation of the refresh counter 3 is executed more than that of the carrier counter 2. Until the logic state outputs of the two counters 2 and 3 coincide with each other, the comparison signal $\phi 7$ of the counter comparator 4 has the "L" level and the refresh request controller 5 is enabled. As a result, the controller 5 outputs the internal refresh request signal $\phi 2$ upon reception of the externally-supplied refresh request signal $\phi 1$, to thereby execute the refreshing operation. When the logic state outputs of the counters 2 and 3 coincide with each other and the level of the comparison signal $\phi 7$ becomes "H", the refresh request controller 5 is disabled, and thus upon reception of the refresh request signal $\phi 1$, the controller 5 does not output the internal refresh request signal $\phi 2$ and does not execute a refreshing operation.

The refreshing operation thereafter is determined by the period of the clock pulse $\phi 4$, and this pulse $\phi 4$ permits the carrier counter 2 to perform its count-up operation and enables the controller 5. Therefore, upon reception of the external refresh request signal $\phi 1$, the controller 5 outputs the internal refresh request signal $\phi 2$ to execute the refreshing operation. This causes the refresh counter 3 to perform its count-up operation, thus rendering the controller 5 disabled again.

Stated another way, until the content of the refresh counter 3 coincides with that of the carrier counter 2, the external refresh request signal $\phi 1$ is accepted, and the refreshing operation performed, but once a coincidence occurs, the refresh request controller 5 is disabled, with the result that a refreshing operation will not be executed upon reception of the signal $\phi 1$. Accordingly, the refresh counter 3 will not keep the count-up operation after the content of the refresh counter 3 exceeds the content of the carrier counter 2, and the difference between the contents of these counters 2 and 3 is the number of refreshing operations to be executed by accepting the external refresh request signal $\phi 1$ at that time.

Once the content of the refresh counter 3 coincides with that of the carrier counter 2 and the external refresh request signal $\phi 1$ is ignored, the clock pulse $\phi 4$ of the output of the refresh period generator 1 causes the carrier counter 2 to perform its count-up operation and no refreshing operation will be performed until the refresh request controller 5 is enabled.

This means that the memory itself has a function to timely select the external refresh request signal $\phi 1$ so that once the comparison signal $\phi 7$ of the counter comparator 4 becomes "H", the refreshing operation thereafter is determined by the period of the clock pulse $\phi 4$ of the output of the internal refresh period generator 1. Accordingly, only the necessary number of refreshing operations for the semiconductor memory circuit 10 are executed and properly setting the period of the clock pulse $\phi 4$ from the refresh period generator 1 can eliminate the unnecessary refreshing operations, thus reducing the average refreshing current.

It should be noted that the carrier counter 2, refresh counter 3, and counter comparator 4 should have their digits set great enough to prevent the overflow (one cycle in this case) of the carrier counter 2 within a standard time for a refresh cycle (512 cycles/8 ms for a 1-Mbit memory).

Figure 3A:
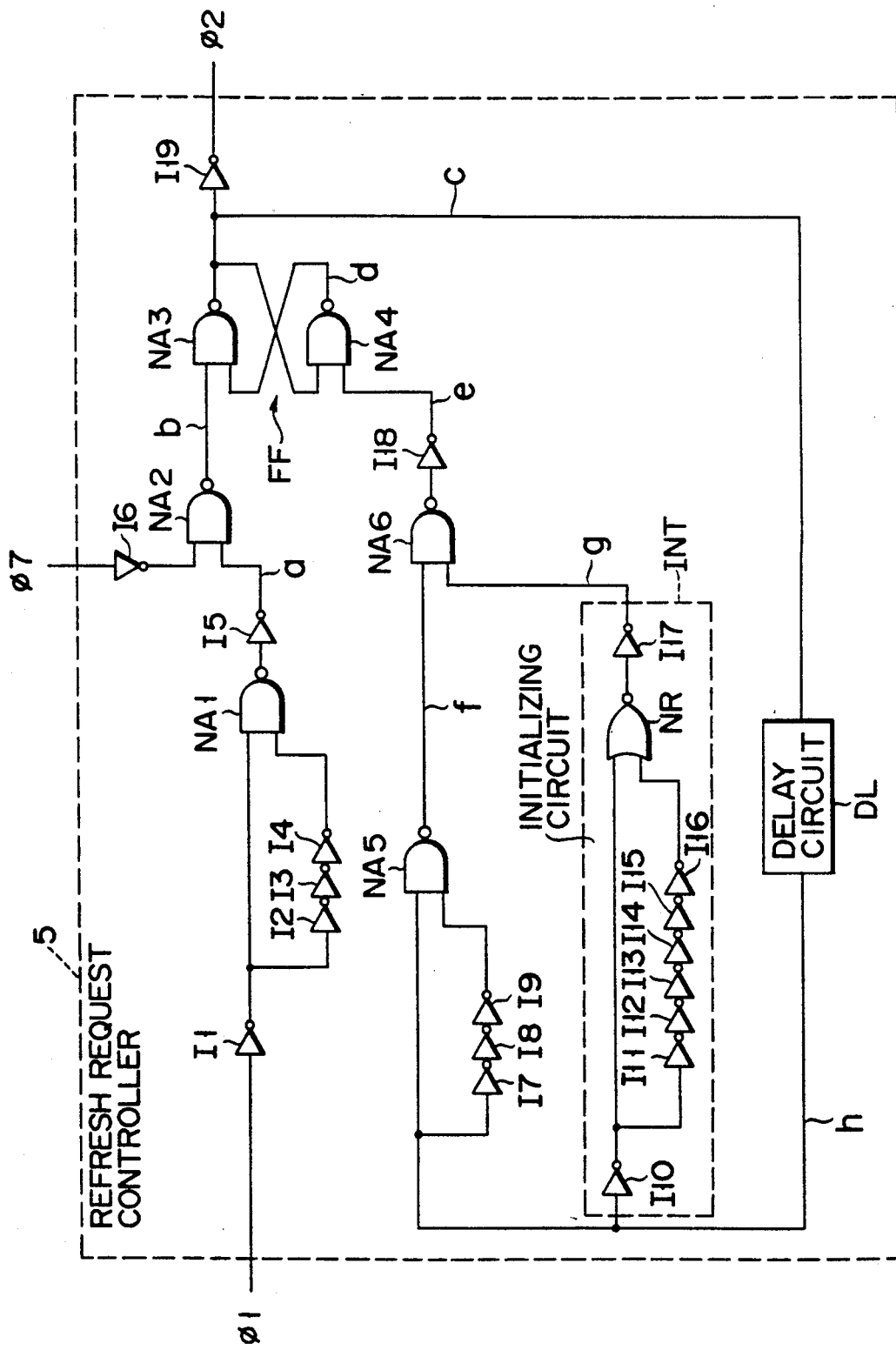
FIG. 3A is a circuit diagram illustrating a practical example of a refresh request controller shown in FIG. 1.
Figure 3B:
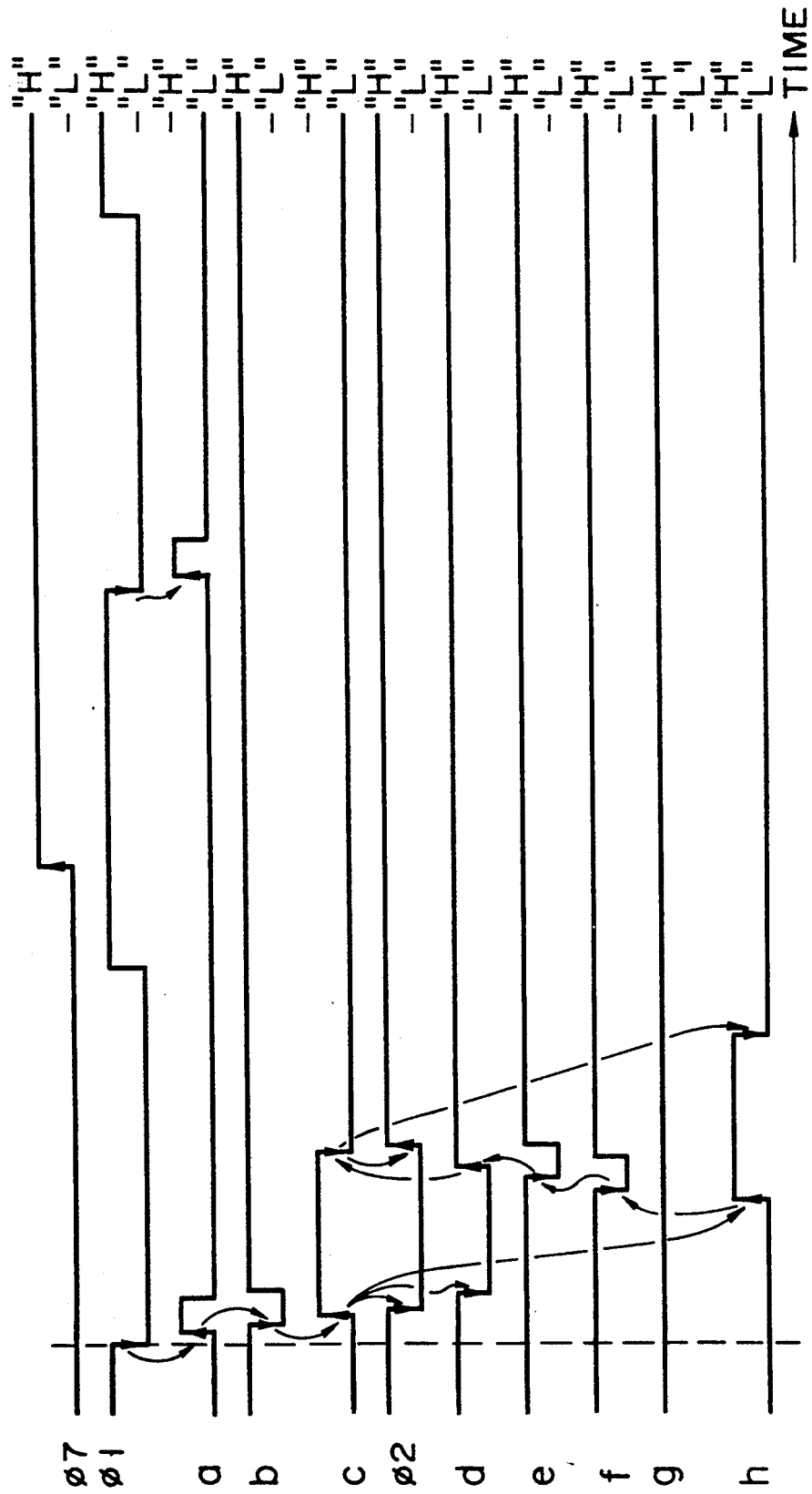
FIG. 3B is a timing chart illustrating the operation of the controller shown in FIG. 3A.

FIGS. 3A and 3B are respectively a circuit diagram illustrating a practical example of the refresh request controller 5 shown in FIG. 1 and a timing chart illustrating its operation.

The external refresh request signal $\phi 1$ is supplied through an inverter I1 to one input terminal of a NAND gate NA1 and to the other input terminal thereof, through the inverter I1 and three-staged inverters I2-I4, these latter inverters serving to delay the output of the inverter I1. The output of the NAND gate NA1 is supplied through an inverter I5 to one input terminal of a NAND gate NA2, the other input terminal of which receives the comparison signal $\phi 7$ from the counter comparator 4, through an inverter I6. The output b of the NAND gate NA2 is an input to a flip-flop circuit FF which has two cross-connected NAND gates, NA3 and NA4. The output c of flip-flop circuit FF is supplied to one input terminal of a NAND gate NA5 through a delay circuit DL whose output h is supplied to the other input terminal of the NAND gate NA5 through three-staged delay inverters I7–I9, and the output f of gate NA5 is supplied to one input terminal of a NAND gate NA6.

The output h of the delay circuit DL is also supplied to one input terminal of a NOR gate NR through an inverter I10 whose own output is supplied to the other input terminal of the NOR gate NR through six-staged delay inverters I11–I16. The output of NOR gate NR is supplied through an inverter I17 to the other input terminal of the NAND gate NA6, whose own output becomes a reset input to the flip-flop circuit FF through an inverter I18. The output c of the flip-flop circuit FF, in turn, is output through an inverter I19, as the internal refresh request signal $\phi 2$. The inverters I10–I17 and NOR gate NR together constitute an initializing circuit INT whose output g becomes the "L" level when the output c of the flip-flop circuit FF is erroneously latched to be at the "H" level upon energization of the memory integrated circuit having this initializing circuit INT, whereby the reset input e of the flip-flop circuit FF is set to "L" to thereby set the level of the output c of the circuit FF to "L."

When the comparison signal $\phi 7$ from the counter comparator 4 is at the "L" level, the refresh request controller 5 is in an enabled state; that is, when the external refresh request signal $\phi 1$ drops from "H" to "L", the output of the NAND gate NA1 temporarily becomes "L", due to signal delay caused by the three-staged inverters I2–I4, and the output a of the inverter I5 temporarily becomes "H." Since the output of the inverter I6 to which the comparison signal $\phi 7$ is supplied has, at this time, the "H" level, the output b of the NAND gate NA2 temporarily becomes "L." The falling of output b from "H" to "L" causes the output c of the flip-flop circuit FF to rise from "L" to "H", and, as a consequence, the reset output d falls from "H" to "L" as a consequence. The rising of the output c of the flip-flop circuit FF from "L" to "H" causes the output of the inverter I19 (i.e., internal refresh request signal $\phi 2$) to fall from "H" to "L", and causes the output h of the delay circuit DL to rise from "L" to "H". Consequently, the output of the NAND gate NA5 temporarily becomes "L", due to signal delay caused by the three-staged inverters I7–I9. At this time, however, the output of the initializing circuit INT stays at the "H" level, due to signal delay by the six-staged inverters I11–I16.

Accordingly, the NAND gate NA6 inverts the output of the NAND gate NA5 and temporarily has an "H" level output, and the output e of the inverter I18 temporarily becomes "L." This raises the reset output d of the flip-flop circuit FF from "L" to "H" whereby the output c of the circuit FF falls to "L". This causes the output of the inverter I19 (internal refresh request signal $\phi 2$) to rise from "L" to "H", and causes the output h of the delay circuit DL to fall to "L."

When the comparison signal $\phi 7$ from the counter comparator 4 has the "H" level, the refresh request controller 5 is in a disabled state. That is, even when the output a of the inverter I5 supplied with the external refresh request signal $\phi 1$ temporarily becomes "H" due to the output of the inverter I6 (supplied with the comparison signal $\phi 7$) becoming "L," the output b of the NAND gate NA2 remains at the "H" level. Therefore, the outputs c and d of the flip-flop circuit FF remain unchanged, the output h of the delay circuit DL stays at the "L" level and the outputs f, g, and e of the NAND gate NA5, initializing circuit INT, and inverter I18 stay at the "H" level.

Figure 4:
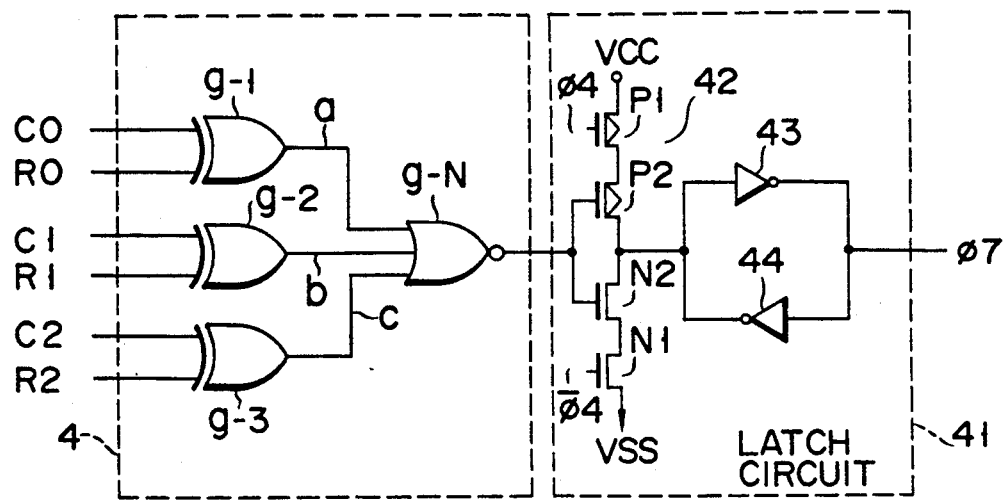
FIG. 4 is a circuit diagram illustrating a modification of the counter comparator shown in FIG. 1.

FIG. 4 is a circuit diagram illustrating a modification of the counter comparator 4 shown in FIG. 1.

The counter comparator 4 in FIG. 4 differs from the counter comparator 4 in FIG. 1 in its having a latch circuit 41 on its output side. This latch circuit 41 is controlled by at least one of clock pulses $\phi 4$ and $\phi 3$ respectively supplied to the counters 2 and 3 (e.g., $\phi 4$ given to the counter 2). The latch circuit 41 is in a latch state to close its input and retain the previous state until the output level of the comparator 4 becomes stable after a change occurred in content of the counter 2; the latch circuit 41 outputs the comparison signal $\phi 7$ by releasing its latch state after the output level of the comparator 4 is stabilized.

The latch circuit 41 comprises a CMOS clocked inverter 42, a CMOS type first inverter 43 having its input coupled to the output terminal of the clocked inverter 42, and a CMOS type second inverter 44 coupled between the input terminal and output terminal (comparison signal output terminal) of the first inverter 43 in a bias direction opposite to that of the inverter 43. The CMOS clocked inverter 42 is supplied with the output of the comparator 4 and is controlled by the clock pulse $\phi 4$ and its inverted clock $\overline{\phi 4}$. P1 and P2 of the clocked inverter 42 are P type MOS transistors, and N1 and N2 are N type MOS transistors, with Vcc and Vss respectively specifying a source voltage and a ground potential.

Figure 5:
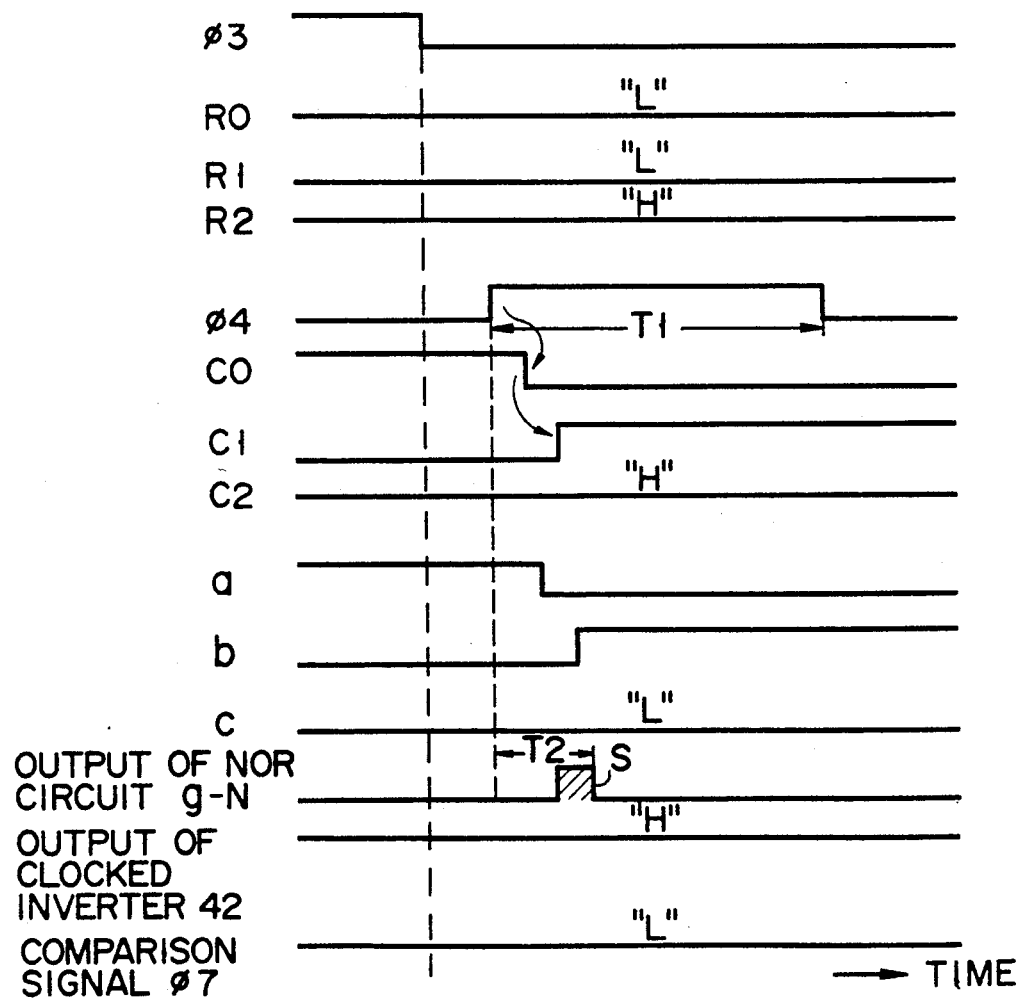
FIG. 5 is a waveform diagram illustrating the operation of the counter comparator shown in FIG. 4.

Referring to FIG. 5, a description will be given below of the operation of the counter comparator, centering on the operation of the latch circuit 41. Since the operations of the counters 2 and 3 and comparator 4 are the same as those described earlier referring to FIG. 1, their detailed description will be omitted.

With the clock pulse $\phi 4$ being "L" and the inverted clock $\overline{\phi 4}$ being "H," the clocked inverter 42 is enabled and functions like an ordinary inverter to invert the output of the comparator 4. The first inverter 43 inverts the output of the clocked inverter 42 and outputs the comparison signal $\phi 7$. In this case, it is necessary to properly set in advance the size (driving force) of the second inverter 44 in such a way that its output does not interfere a change in output of the clocked inverter 42.

Let us assume that when the logic state outputs R0, R1 and R2 of the refresh counter 3 are respectively "L," "L" and "H" and the pulse $\phi 4$ rises to "H" from "L," the logic state outputs C0, C1 and C2 of the carrier counter 2 are sequentially (i.e., asynchronously) changed to "L," "H", and "H" from "H," "L", and "H" respectively, due to the internal signal delay of the counter 2. Then, the outputs a and b of the exclusive OR circuits g-1 and g-2 of the comparator 4 sequentially become noncoincidence outputs and a pseudo comparison signal s temporarily appears at the output of the NOR circuit g-N, due to the time difference between the outputs a and b. However, since the clocked inverter 42 is disabled at this time, the output of the latch circuit 41 is not dependent on the input (output of the comparator 4) and the circuit 41 is in a latch state where the comparison signal $\phi 7$ is stably output while being held by the first and second inverters 43 and 44.

Given that the "H"-level duration of the clock pulse $\phi 4$ of the carrier counter 2 is T1 and the time in which the pseudo comparison signal s appearing at the output terminal of the comparator 4 stably becomes the true comparison signal $\phi 7$ after the clock pulse $\phi 4$ rises from "L" to "H" is T2, the relation T1>T2 should be set. With this relation satisfied, therefore, the pseudo comparison signal s, even when it temporarily appears at the output terminal of the comparator 4, as mentioned earlier, the latch circuit 41 has its input closed at this time and can prevent the pseudo comparison signal s from being output. When the output level of the comparator 4 stably becomes that of the comparison signal $\phi 7$ and the clock pulse $\phi 4$ becomes "L", the clocked inverter 42 is enabled to latch the true output of the comparator 4 (release the latch state), as described above.

As described above, the provision of the latch circuit 41 on the output side of the counter comparator 4 can prevent pseudo comparison signal s from being temporarily output even when there is an internal transmission delay of the counters or a delay originating from the resistance or capacitance of wires thereof. Accordingly, the true comparison signal can be output stably, and therefore it is possible to realize a semiconductor memory which selectively accepts an external refresh request signal, and in so doing, significantly reduces the average refreshing current consumed, and has improved reliability.

The aforementioned counter comparator can be effectively applied not only to an asynchronous counter but also a synchronous counter or to a case where the pseudo comparison signal s is generated due to a delay originated from the resistance or capacitance of wires of the counter.

Figure 6:
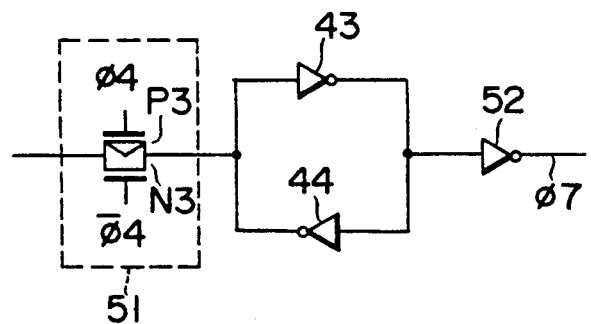
FIGS. 6 and 7 are circuit diagrams illustrating modifications of a latch circuit in the counter comparator shown in FIG. 4.
Figure 7:
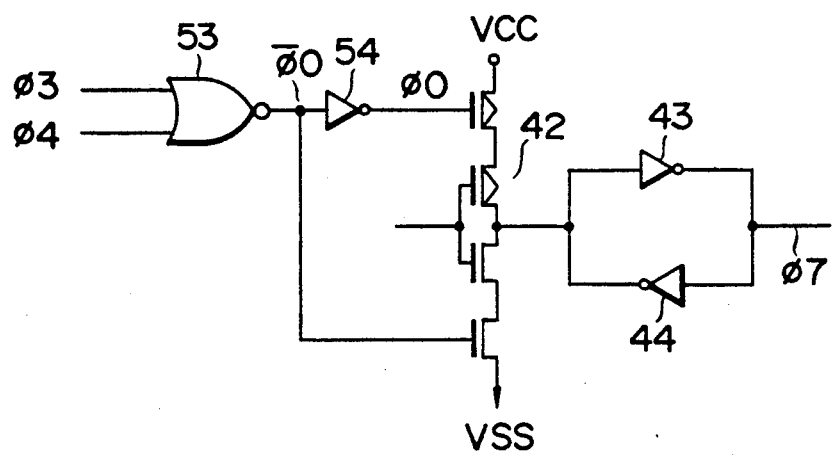

FIGS. 6 and 7 illustrate modifications of the latch circuit 41 in the counter comparator shown in FIG. 4.

The latch circuit shown in FIG. 6 differs from the one shown in FIG. 4 in that the clocked inverter 42 is replaced with a CMOS transfer gate 51 and a CMOS type third inverter 52 is additionally connected on the output side of the first inverter 43. The transfer gate 51 comprises a P type MOS transistor P3 and an N type MOS transistor N3 and is enabled when the clock pulse $\phi 4$ is "L" and its inverted clock $\overline{\phi 4}$ is "H."

The latch circuit shown in FIG. 7 is designed in such that the clock pulses $\phi 3$ and $\phi 4$ are input to a NOR gate 53 to produce an inverted clock $\overline{\phi 0}$, this pulse $\overline{\phi 0}$ is input to an inverter 54 to produce a clock pulse $\phi 0$, and these pulses $\overline{\phi 0}$ and $\phi 0$ are used in place of $\overline{\phi 4}$ and $\phi 4$ used in the latch circuit 41 in FIG. 4. In this case, as described above, it is possible to prevent the pseudo comparison signal s from being output due to the internal transmission delay of the carrier counter 2 which is supplied with the clock pulse $\phi 4$ as well as due to the internal transmission delay of the refresh counter 3 supplied with the clock pulse $\phi 3$.

The refresh counter 3 in FIG. 1 may be shared by an internal address counter of the semiconductor memory circuit 10.

Figure 8:
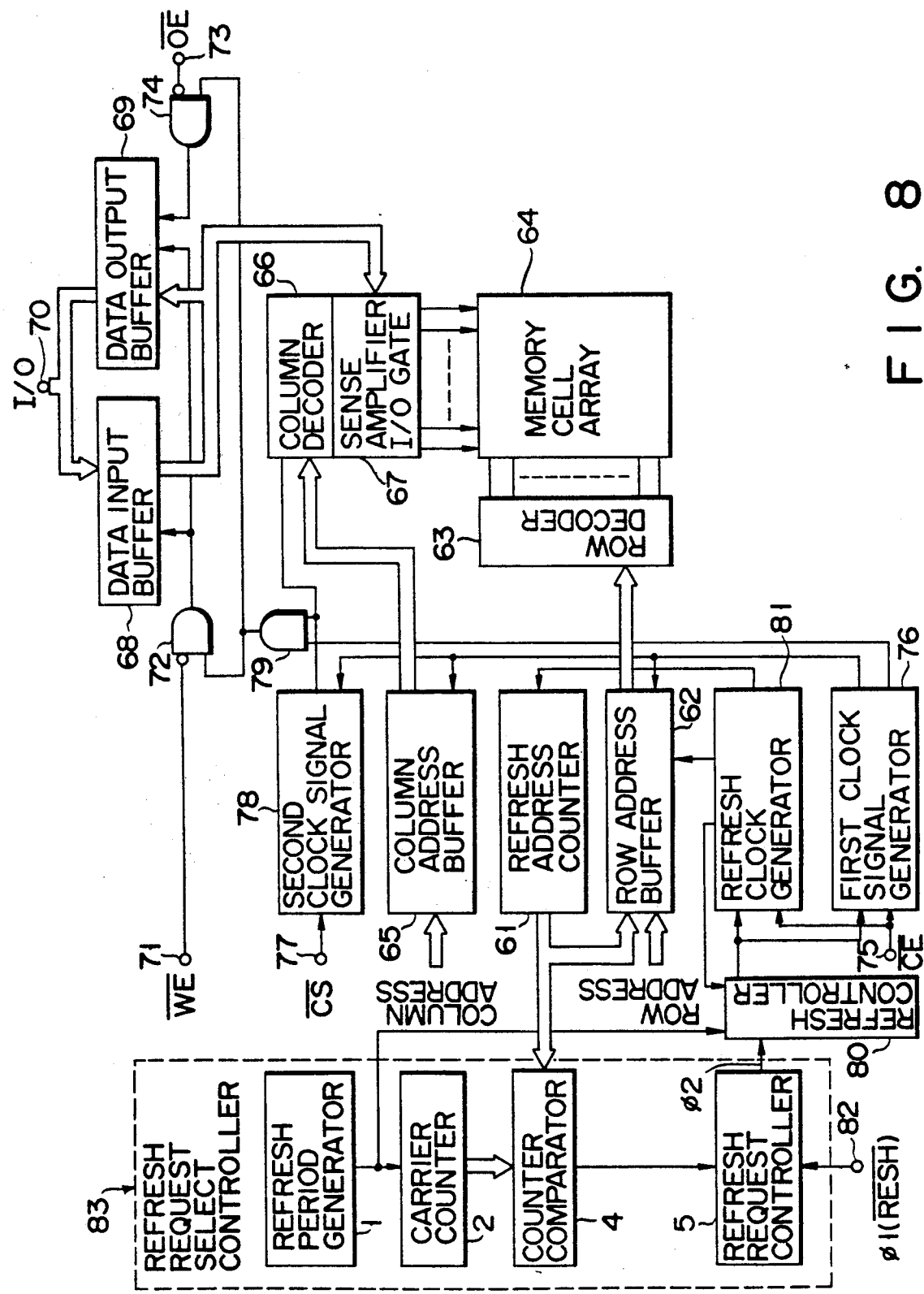
FIG. 8 is a circuit diagram illustrating a semiconductor memory according to another embodiment of this invention.

FIG. 8 is a block diagram illustrating a pseudo SRAM (Static Random Access Memory) representing another embodiment of this invention (this memory being referred to as PSRAM hereafter).

In this PSRAM, reference numeral 61 denotes a refresh address counter, 62 a row address buffer for selectively outputting a row address signal and the output of the counter 61, 63 a row decoder, 64 a memory cell array, 65 a column address buffer, 66 a column decoder, 67 a sense amplifier and input/output (I/0) gate, 68 a data input buffer, 69 a data output buffer, 70 an I/O pin, 71 a write enable ($\overline{WE}$) signal input pin, 72 a $\overline{WE}$ signal input buffer, 73 an output enable ($\overline{OE}$) signal input pin, 74 an $\overline{OE}$ signal input buffer, 75 a chip enable ($\overline{CE}$) signal pin, 76 a first clock signal generator, 77 a chip select ($\overline{CS}$) signal input pin, 78 a second clock signal generator, 79 a clock signal buffer, 80 a refresh controller, 81 a refresh clock generator, and 82 an $\overline{RFSH}$ pin supplied with an external refresh request signal $\phi 1$ ($\overline{RFSH}$). A refresh request select controller 83 is further provided in the PSRAM, and it comprises the refresh period generator 1, carrier counter 2, counter comparator 4 and refresh request controller 5 as shown in FIG. 1. The refresh request signal $\phi 1$ externally supplied through the $\overline{RFSH}$ pin 82 is supplied to the refresh request controller 5 and the internal refresh request signal $\phi 2$ from the controller 5 is supplied to the refresh controller 80. The counter comparator 4 compares the logic state output of the carrier counter 2 with the logic state output of the refresh address counter 61 (corresponding to the refresh counter 3 in FIG. 1). In order to realize a self-refreshing mode, the output of the refresh period generator 1 is also supplied to the refresh controller 80.

According to this PSRAM, when the refresh request signal $\phi 1$ is input to the $\overline{RFSH}$ pin 82, the refresh request select controller 83 operates as described above with reference to FIG. 1 and outputs the internal refresh request signal $\phi 2$, so that the memory cells of the memory cell array 64 should always execute a refreshing operation (called auto-refreshing operation). When the refresh controller 80 accepts the output of the refresh period generator 1, the refreshing operation of the memory cells are executed in association with the period of the output of the generator 1. (This operation is called a self-refreshing operation.)

The counter comparator as shown in FIGS. 4, 6, and 7 may be applied to the counter comparator 4 of the refresh request select controller 83 in the PSRAM.

If the refresh request signal is input in a time-distributed manner in a system using a plurality of present semiconductor memories, it is possible to reduce the chance of all the memories actually performing the refreshing operation with respect to a single refresh request signal input, thus preventing concentration of the refreshing current. This is because there is a variation in the period of the outputs of the refresh period generators of the individual memories, so that the outputs of the individual carrier counters for counting the outputs of these generators are likely to differ from one another, and whether or not the refreshing operation can be executed with respect to the external refresh request signal differs depending on the states of the individual memories.

In a case where supplying the refresh request signal is concentrated at a specific time, all the memories simultaneously execute the refreshing operation for the first several occasions with respect to the supplied refresh request signal, and thus, the concentration of the refresh request signal cannot be prevented. In any case, however, in either the case where the refresh request signal is time-distributed or where it is concentrated at a specific time, the number of refreshing operations executed can be reduced by the period of the output of the refresh period generator and the average refreshing current consumed within one refresh cycle can be reduced.

This system is therefore effective when a battery is used as a backup power source.

This invention is in no way restricted to the above particular embodiments as described above with reference to the accompanying drawings, but can be modified in various manners within the scope and spirit of the invention.

What is claimed is:

1. A semiconductor memory comprising:
   a semiconductor memory circuit which requires data refresh;
   a first counter for counting the number of times the semiconductor memory circuit requires data refresh operations;
   a second counter for counting the number of times the semiconductor memory circuit has performed the data refresh operations;
   a counter comparator for comparing an output of the first counter and an output of the second counter with each other; and
   control means for receiving a comparison signal output from the counter comparator, as well as a refresh request signal externally supplied, and for outputting a refresh clock signal to the semiconductor memory circuit in response to the comparison signal and the refresh request signal.

2. A semiconductor memory according to claim 1, wherein the control means comprises:
   a refresh request controller for receiving the comparison signal of the counter comparator and the externally-supplied refresh request signal, the refresh request controller being controlled to be in a disabled state in accordance with a comparison signal which is output from the control means when the output of the first counter and the output of the second counter coincide with each other, and controlled to be in an enabled state in accordance with a comparison signal which is output from the control means when the output of the first counter and the output of the second counter do not coincide with each other, the refresh request controller in the enabled state accepting the externally-supplied refresh request signal and outputting an internal refresh request signal; and
   a refresh clock generator for receiving the internal refresh signal output from the refresh request controller and outputting the refresh clock signal.

3. A semiconductor memory according to claim 2, wherein the refresh clock generator receives the internal refresh request signal and outputs a clock signal, to be used for counting, to the second counter.

4. A semiconductor memory according to claim 1, wherein a latch circuit, for latching the comparison signal of the counter comparator for a predetermined period of time, is provided on the output side of the counter comparator.

5. A data refresh system for a semiconductor memory requiring data refresh, comprising:
   first counting means for counting the number of times the semiconductor memory requires data refresh and for generating an output indicating the number of times data refresh should be performed on the semiconductor memory;
   second counting means for counting the number of times data refresh has been performed on the semiconductor memory and for generating an output indicating the number of times data refresh has been performed on the semiconductor memory;
   comparator means for comparing the output of the first counting means with the output of the second counting means and for generating a comparison signal when the output of the first counting means equals the output of the second counting means; and
   control means for receiving the comparison signal output from the comparator means, a refresh request signal externally supplied, and for outputting a refresh signal to perform data refresh on the semiconductor memory.

6. A data refresh system according to claim 5 further comprising, a latch circuit for latching the comparison signal for a predetermined period of time provided on the output side of the comparator means.

* * * * *